United States Patent [19]
Amemiya

[11] Patent Number: 5,756,237
[45] Date of Patent: May 26, 1998

[54] PRODUCTION OF PROJECTION MASK

[75] Inventor: Isao Amemiya, Yamanashi, Japan

[73] Assignee: Hoya Corporation, Tokyo, Japan

[21] Appl. No.: 791,572

[22] Filed: Jan. 31, 1997

[30] Foreign Application Priority Data

Jan. 31, 1996 [JP] Japan .................................. 8-038965

[51] Int. Cl.$^6$ ...................................................... G03F 9/00
[52] U.S. Cl. ............................................ 430/5; 430/323
[58] Field of Search ............................. 430/5, 313, 314, 430/316, 323

[56] References Cited

U.S. PATENT DOCUMENTS 5,468,338  11/1995  Shahid ................................. 156/654

FOREIGN PATENT DOCUMENTS

| 60-81750 | 5/1985 | Japan . |
| 5-217876 | 8/1993 | Japan . |
| 7-135129 | 5/1995 | Japan . |
| 7-288223 | 10/1995 | Japan . |

*Primary Examiner*—S. Rosasco
*Attorney, Agent, or Firm*—Sughrue, Mion, Zinn, Macpeak & Seas, PLLC

[57] ABSTRACT

In a process of manufacturing a plurality of projection masks from a substrate at one time, the substrate is subjected only to wet etching on the reverse thereof to form grooves and is separated into the plurality of the projection masks by the use of the grooves formed on the reverse of the substrate.

22 Claims, 8 Drawing Sheets

PRODUCTION OF PROJECTION MASK

BACKGROUND OF THE INVENTION

The present invention relates to a process of producing or manufacturing projection masks which have apertures in place of transparent parts for transmission and, more particularly, to a process of producing a plurality of projection masks at one time from a single substrate.

A recent improvement in the electron beam lithography, which is designed to perform patterning with an electron beam, is the writing system called block exposure or E-beam cell projection lithography. It is expected to be the LSI technology of next generation because of its capability of writing extremely fine patterns in a short time for high throughput (see Japanese Unexamined Patent Publication No. 81750/1985).

The E-beam cell projection lithography employs a projection mask (or stencil mask) which has apertures (conforming to the patterns for exposure) formed in a silicon membrane (tens of micron thick). The apertures permit the electron beam to pass through for exposure of a specified block or cell. By repeating exposure through selected apertures, it is possible to connect partial patterns and complete a desired pattern.

The writing system by E-beam cell projection lithography has been devised to solve the problem with low throughput inevitably accompanied in an E-beam cell projection direct writing system which has been now practically used and which uses a conventional variable-shaped beam method. Herein, it is noted that the E-beam direct writing system is for writing a pattern in a serial fashion by scanning a small spot of electron beam. Therefore, it takes an extremely long time for writing. By contrast, the E-beam cell projection lithography is much faster, even compared with direct writing through a variable rectangle.

The projection mask for cell projection has been manufactured in various ways. It is usually formed by a silicon substrate (or a commercial silicon wafer), because of easy fabrication and high strength. Specifically, the process consists of etching the reverse side of a silicon substrate, thereby forming a frame and a membrane supported by the frame, and forming apertures in the membrane. The etching is usually carried out by wet etching with an inorganic or organic alkaline aqueous solution. The formation of apertures is usually done by dry etching for high precision.

For adequate etching from both the obverse and reverse, the substrate usually has an etch stopper layer at a proper depth in it. The silicon substrate which includes an etch stopper layer will be exemplified as follows.

(a) SOI (silicon on insulator) substrate which is composed of two silicon substrates of different thicknesses, with an $SiO_2$ layer interposed therebetween.

(b) SIMOX (separation by implanted oxygen) substrate which has an oxide film formed by dense implantation of oxygen ions and heat treatment.

(c) Multi-layer substrate which has a boron-rich layer (as an etch stopper layer) at a proper depth in a silicon substrate.

A common process for producing the conventional projection mask (stencil mask) will be described with reference to FIGS. 1A through 1F.

In FIGS. 1A through 1F, there is shown an SOI substrate 10 which is composed of an Si layer 1 (20 μm thick), an $SiO_2$ layer 2 (2 μm thick), and an Si layer 3 (500 μm thick). On the obverse of the substrate 10 is deposited a dry etching mask 4 (3 μm thick) formed by $SiO_2$ or the like (FIG. 1A).

Then, a resist 5 is coated on the dry etching mask 4. The resist 5 and the dry etching mask 4 are patterned by the lithography and dry etching technologies (FIG. 1B) to provide desired patterns. Thereafter, the resist is removed.

Using the patterned dry etching mask 4 as a mask, dry etching is performed to make grooves reaching the $SiO_2$ layer 2 which serves as an etch stopper layer afterward. Thus, there is formed the aperture pattern 11 which shapes the beam (FIG. 1C).

The entire surface is covered with a protective layer of $Si_3N_4$ which functions as a wet etching mask 6. The protective layer on the reverse is partially removed by the lithography technology which employs a resist, so that a part of silicon is exposed to which a recess, namely, a window is formed afterward (FIG. 1D).

The exposed part of silicon on the reverse undergoes anisotropic etching up to the $SiO_2$ layer 2 (acting as the etch stopper layer) with an etchant (such as KOH aqueous solution) at 70°–100° C., so that the recess, namely, the window 12 is formed in the silicon layer 3. In this way, there are formed a frame 13 and a membrane 14 supported by the frame 13 (FIG. 1E).

The $SiO_2$ layer 2 (as the etch stopper layer) is removed by dissolution in dilute hydrofluoric acid. Now, there is obtained an aperture pattern 11. Before or after the removal of the $SiO_2$ layer 2, the dry etching mask ($SiO_2$ layer 4) and the wet etching mask ($Si_3N_4$ layer 6) are removed. In this way, a desired projection mask of silicon is produced (FIG. 1F).

Finally, the projection mask is coated with an optional conductor layer 15 of heavy metal.

The projection mask produced as mentioned above is about 5–50 mm in size so that it can be mounted on the electron beam writing apparatus for cell projection exposure. This size is smaller than the area that is covered by the writing apparatus used for the production of the projection mask. Therefore, it is common practice for high productivity to make a plurality of projection masks at one time by performing patterning on a large substrate.

Production in this manner needs the step of dicing to separate individual projection masks from the substrate. This is accomplished by either of the following two ways—separation by a dicing saw (with round blade) and separation by chemical etching with an acid or alkali (separation by a laser beam is possible but uncommon because of problems with throughput and cleanliness).

The conventional dicing methods pose several problems as mentioned below.

The first dicing method consists of fixing a substrate onto a support by the aid of paraffin wax, mechanically cutting the substrate using a round or circular blade, melting the wax by heating, removing the substrate from the support, and washing the cut pieces with acid and alcohol. In this way, there are obtained a plurality of transfer masks of desired size.

This method is similar to that used to mechanically cut and separate a semiconductor wafer into a number of LSI chips. When used to dice projection masks, this method has several problems.

The first problem is that the membrane is damaged by strain or stress. As shown in FIG. 1F, the aperture pattern of the projection mask is formed in a membrane. It is to be noted that the membrane is vulnerable to strain due to expansion and contraction that occurs when the wax is heated and cooled for the mounting and demounting of a substrate and which is also vulnerable to mechanical stress during the dicing step.

A possible measure to solve this problem is to perform dicing first and then process individual transfer masks to form the recess or window on the reverse. The procedure in this manner can prevent the membrane from being damaged but is extremely poor in productivity because of the necessity of fabricating projection masks individually. In addition, it is also necessary to form a protective layer on the peripheral wall of the cut projection mask so as to protect it from the etchant used to make the window. This is not practical for commercial production.

Moreover, the additional step of fixing a substrate with wax is another disadvantage for production in a short time. Other drawbacks are to require a dicing apparatus and to provide low yields by contamination with fine sawing chips.

The second dicing method is disclosed in Japanese Unexamined Patent Publication No. 135129/1995 and will be described with reference to FIGS. 2A and 2B. According to this method, a groove 16 of a prescribed depth is formed by etching along the boundary between individual projection masks at the same time when the aperture pattern 11 is formed by etching on the obverse of the SIO substrate, as shown in FIG. 2A.

Then, another groove 16 is formed by etching on the reverse of the substrate at the position opposite to the groove formed on the obverse of the substrate (along the boundary between individual projection masks) at the same time when the window is formed by wet etching on the reverse of the substrate, as shown in FIG. 2B. As the groove on the reverse of the substrate reaches the etch stopper $SiO_2$ layer, the substrate is sheared into the projection masks by their own weight to be separated from one another. Incidentally, the SIO substrate is bonded to a glass plate by the use of wax to protect the SIO substrate from the etchant during fabrication of the reverse of the substrate.

Advantageously, this method is free from contamination with sawing chips which otherwise might occur during the dicing. Another advantage is that no additional steps are necessary to form grooves on both the obverse and reverse of the substrate because they are formed simultaneously with etching which is essential for the fabrication of projection masks.

A further improvement on this method is also described in the above-mentioned publication. This improvement is intended to prevent the groove on the obverse from being dislocated from the groove on the reverse. This dislocation occurs as the groove on the reverse becomes wider by wet etching and gives rise to occurrence of a thin film projection from the periphery of the silicon layer above the etch stopper $SiO_2$ layer. The projection is mechanically weak and is easily dropped onto the projection masks. As a result, the projection mask is contaminated by the projection. According to the improvement, the position of the groove on the obverse is shifted inside to avoid the projection.

Nevertheless, the above-mentioned method has many problems left unsolved in actual production. One of them is concerned with the necessity of forming a wet etching mask layer on the obverse (on which the aperture pattern is formed) for protection of the aperture pattern and of fixing the silicon substrate to a glass plate by means of an adhesive such as wax for further stabilization, with the periphery of the substrate sealed for protection from the etchant.

Fixing the substrate to a glass plate offers the advantage that when the wet etching is completed (or when the individual projection masks are separated from the silicon substrate), there is no possibility of projection masks dispersing into the etchant and it is possible to recover projection masks collectively by taking out the glass plate from the etchant. This facilitates handling. However, this method poses the following problem.

When wet etching has been completed and individual projection masks have been separated from the silicon substrate, the weak silicon oxide film remaining in the groove for mask separation is broken by the weight of the mask. The broken part permits the etchant to infiltrate and to corrode the side wall and aperture of the mask.

In addition, the adhesive (such as wax) to fix the silicon substrate to the glass plate is not resistant to hot KOH solution or organic alkaline aqueous solution such as EPW (ethylenehexadiamine and pyrocatechol dissolved in water). This will cause the mask surface to be corroded.

Further, the adhesive (such as wax) shrinks on solidification and gives a damage (such as cracking) to the aperture pattern due to stress. Wax also gives rise to stress when it melts and becomes fluid on heating.

Removing the adhesive from the mask needs a solvent and takes a long time. This lengthens the time required for mask production (adhesion between the silicon substrate and the glass plate is so firm to prevent the entrapment of air bubbles or seeds and the infiltration of alkali etchant that any solvent does not dissolve the adhesive rapidly).

If the adhesive is wax, it is possible to fluidize wax by heating and melting and then detach the mask from the support. Now the mask is ready for dipping in a solution to remove wax. However, a problem is involved in this case, too. That is, a low-melting paraffin wax is not resistant to organic alkali solutions and hence does not protect the mask surface from corrosion. One way to solve this problem is to use tar-wax which is slightly resistant to hot alkaline aqueous solutions. Another problem arises in this case. That is, removal of tar-wax needs chlorinated organic solvents (such as methylene chloride or trichloroethylene) which are subject to regulations. Using such solvents is not suitable for mass production.

An alternative way to avoid the above-mentioned drawbacks is to change the order of steps. That is, the wet etching process comes first, and then the aperture pattern is formed on the obverse and the groove to separate masks is formed by etching at the same time. Finally, the masks are separated from the substrate. The disadvantage of this procedure is that the substrate has to be kept at a certain temperature during dry etching so as to produce deep, vertical grooves in silicon for aperture patterning. To achieve this object, it is necessary to cool the substrate by blowing a cooling gas against the substrate at all times during etching or to introduce a heating medium (such as helium gas) to the reverse of the substrate. Another possible way to keep the substrate temperature constant is to bring the substrate into close contact with an electrode by electrostatic attraction. However, none of them are satisfactory because the substrate is subject to stress due to pressure difference (on both sides) or forced attraction and hence the weak part will be broken during etching (at this stage, the groove on the reverse is already formed).

SUMMARY OF THE INVENTION

The present invention was completed in view of the foregoing.

It is an object of the present invention to provide a process for producing efficiently in high yields projection masks having accurate external dimensions and peripheral side walls.

A process to which this invention is applicable is for use in manufacturing a plurality of projection masks at one time from a substrate having an obverse and a reverse. Each of the projection masks comprises a frame, a membrane supported by the frame, and apertures formed in the membrane. According to an aspect of this invention, the process comprises the steps of forming grooves on the reverse of the substrate only by wet etching and separating the substrate into the projection masks by the use of the grooves formed on the reverse of the substrate.

In this event, the substrate may be formed by a material selected from the group consisting of a silicon substrate, a laminate silicon substrate, and a multilayer silicon substrate and has the obverse and the reverse of the (100) plane. The etching is carried out so that the frame and the grooves have a slope angle within a range between 54 and 56 degrees. Preferably, the process further comprises the step of forming a binder film to prevent the separation of projection masks after completion of the wet etching from the reverse and before separation of the individual projection masks. The binder film may be formed from at least one material selected from the group consisting of fluorine resin, ethylene resin, propylene resin, butadiene resin, silicone resin, and styrene resin, a gummy material derived therefrom, and an inorganic film-forming material.

In addition, the step of forming the grooves of a prescribed depth by wet etching on the reverse of the substrate to separate projection masks is carried out by the use of the same etchant as the step of forming, by wet etching on the reverse of the projection mask, a window to thereby form the frame and the membrane.

Furthermore, the step of forming the grooves may be followed by the step of forming a window on the lower part of the membrane on the reverse of the projection mask and thereafter by the subsequent step of completing forming the grooves by wet etching. The window may be covered with a protective material to form a protective layer.

When the substrate is used which comprises an etching stopper layer interposed between a pair of semiconductor layers providing the obverse and the reverse of the substrate, the process comprises the steps of removing the etching stopper layer by etching after the grooves and a window are formed to separate the projection masks and to expose the frame and the membrane, covering, with a protective material, the membrane which has a lower part exposed within the window on the reverse of the substrate, and thereafter completing the grooves by wet etching.

According to another aspect of this invention, the process comprises the steps of preparing a substrate which has an obverse and a reverse, at least said reverse being specified by the (001) plane, forming, by etching, grooves which run along horizontal and vertical directions to form a lattice such that the vertical and the horizontal grooves are parallel to and perpendicular to the crystal axis of the reverse of the silicon substrate, respectively, and dividing the substrate into individual projection masks. In this case, the substrate may be formed by a substrate selected from the group consisting of a silicon substrate, a laminate silicon substrate, and a multi-layer silicon substrate while the grooves formed for separation on the reverse of the substrate have a depth smaller than two-thirds the total thickness of the substrate. Preferably, the etching for the frame and the grooves is carried out so that the frame and the grooves have a slope angle within a range between 54 and 56 degrees.

In addition, the separation by breaking along the grooves may be carried out within a selected one of flowing water or flowing solvent.

Further, the wet etching to form the grooves and/or the window on the reverse of the projection mask employs a masking layer to protect those parts which are not etched. The masking layer is made of a metal selected from the group consisting of tungsten, zirconium, nickel, chromium, titanium, an alloy thereof, and a metal compound thereof containing at least one element selected from oxygen, nitrogen, and carbon.

DESCRIPTION OF THE PREFERRED EMBODIMENTS

The first aspect of the present invention will be described in detail as follows.

According to the first aspect of the present invention, a plurality or a lot of projection masks, each consisting of a frame, a membrane supported by the frame, and apertures formed in the membrane, are produced at a time by forming them on a substrate and separating them from the substrate by etching.

The separation of projection masks from the substrate by etching is accomplished by forming grooves on the reverse of the substrate by wet etching and continuing the wet etching until the grooves reach the obverse of the substrate. In other words, the present invention is characterized in that the separation of projection masks is accomplished only by wet etching on the reverse of the substrate. The separation of projection masks in this manner is intended to solve problems involved in the prior art technology. If projection masks are to be separated from the substrate by performing etching on both the obverse and the reverse of the substrate according to the method disclosed in Japanese Unexamined Patent Publication No. 135129/1995, grooves on the obverse will be dislocated from those on the reverse. A measure against this has been proposed in Japanese Unexamined Patent Publication No. 288223/1995. However, this proposal involves difficulties in controlling the groove etching because of the extremely large etching area.

By contrast, the process of the present invention never causes the problem to occur in connection with dislocation at all because grooves are formed only in one direction to separate projection masks from the substrate. In addition, the present invention has the advantages of yielding projection masks free from structurally weak parts and of yielding projection masks with accurate external dimensions and peripheral walls in spite of its simple process.

In a preferred embodiment of the present invention, the substrate may be composed of a silicon substrate, a laminate silicon substrate, or a multi-layer silicon substrate. At any rate, each substrate may have the obverse and the reverse of the (100) plane. In addition, an etching angle of the frame and the grooves preferably falls within a range between 54 and 56 degrees.

Figure 1A:
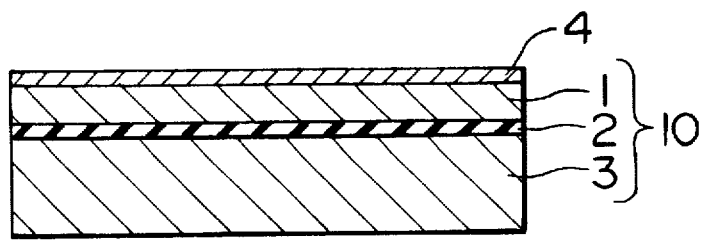
FIGS. 1A through 1F are schematic sectional views illustrating the steps of fabrication by the conventional process.
Figure 1B:
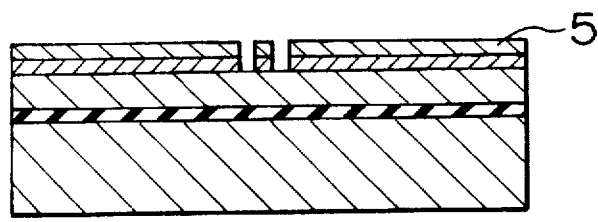
Figure 1C:
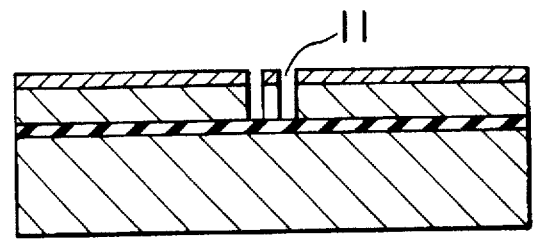
Figure 1D:
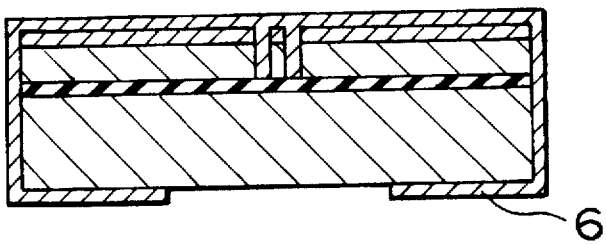
Figure 1E:
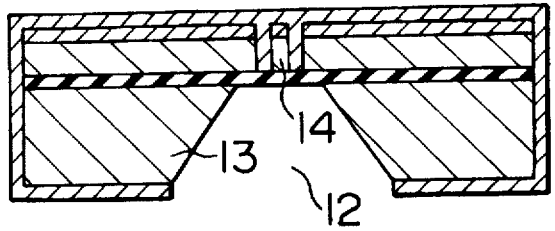
Figure 1F:
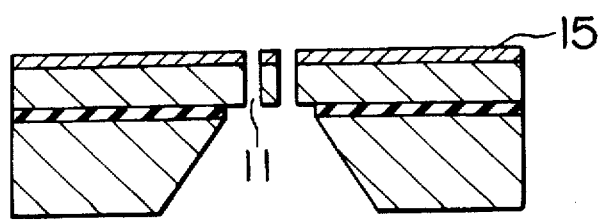
Figure 2A:
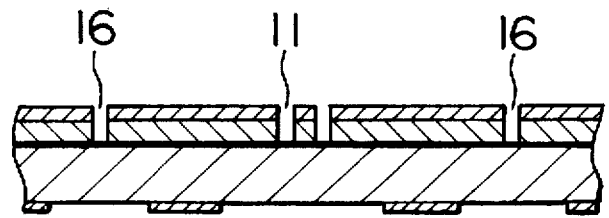
FIGS. 2A and 2B are schematic sectional views illustrating the conventional method of separating projection masks.
Figure 2B:
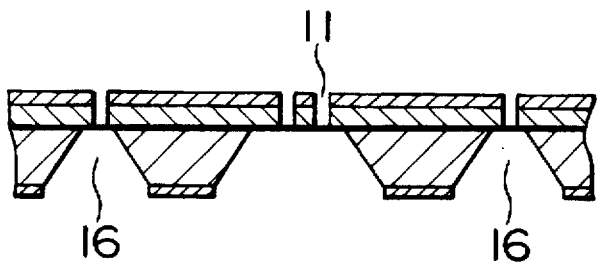
Figure 3:
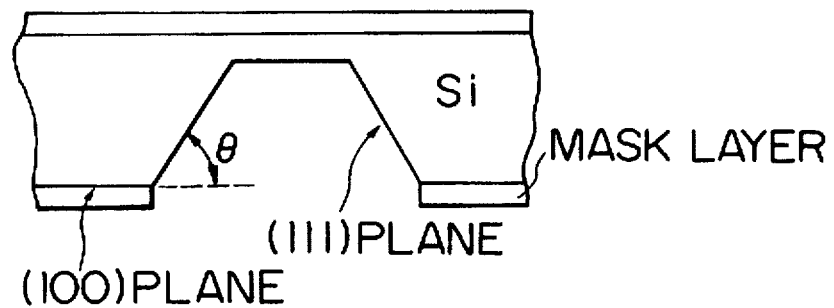
FIG. 3 is a schematic partial sectional view illustrating the anisotropic etching of silicon.

In another preferred embodiment of the present invention, the substrate may be also composed of a silicon substrate, a laminate silicon substrate, or a multi-layer silicon substrate, with at least the reverse of the (100) plane exposed. The grooves for separation are formed in the vertical and horizontal directions on the reverse of the substrate and also in the parallel and perpendicular directions with respect to the crystal axis of the reverse of the silicon substrate. This embodiment makes it possible to perform wet etching with an alkaline aqueous solution such that the etched grooves have a constant slope angle of about 54.73° ($Tan^{-1}\sqrt{2}$) (see FIG. 3). The reason for this is that the rate of dissolution in alkaline aqueous solution differs between the (100) plane and the (111) plane because of their different number of unpaired electrons.

The constant slope angle of etching mentioned above contributes to the projection masks having accurate external dimensions and peripheral walls.

Figure 4:
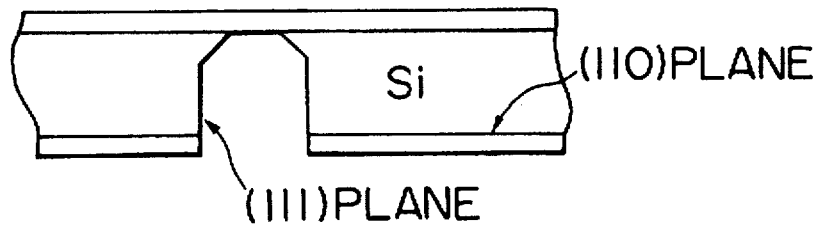
FIG. 4 is a schematic partial sectional view illustrating another embodiment of the anisotropic etching of silicon.

Merely for reference, FIG. 4 shows how etching takes place in a substrate which has the reverse or a rear surface specified by an orientation plane of (110), namely, the (110) plane. As illustrated in FIG. 4, rotation is caused to occur by $Tan^{-1}\sqrt{2}$ in the window in relation to a direction of a crystal axis. As a result, the etching causes a tapered portion to occur at a certain depth.

In a preferred embodiment of the present invention, a binder film is formed to prevent the separation of projection masks at the stage after the wet etching from the reverse has been completed and before the individual projection masks are separated. Without this binder film, projection masks would disperse into the etchant as soon as grooves are formed by wet etching from the reverse. This presents difficulties in recovering dispersed projection masks from the etchant and creates the possibility that dispersed projection masks are damaged by mutual collision (leading to low yields).

The binder film is not specifically restricted so long as it is fully resistant to alkaline aqueous solutions (as an etchant for silicon) and dilute hydrofluoric acid (as an etchant for the etch stopper layer of silicon oxide) and has adhesive strength sufficient to prevent the dispersion of projection masks. It should preferably be flexible.

The binder film may be formed from at least one resin selected from fluorine resin, ethylene resin, propylene resin, butadiene resin, silicone resin, and styrene resin, or from a gummy material derived therefrom, or from a photosensitive resin, or from an inorganic film-forming material (such as SOG and SiN).

The binder film may be formed directly on the substrate, or on the dry etching mask formed on the obverse of the substrate, or on the wet etching mask formed on the reverse of the substrate. The binder film may be gummified afterward by moderate heat treatment. Moreover, the binder film may undergo patterning.

Owing to the binder film, it is possible to prevent projection masks from dispersing into the etchant and recover separated projection masks collectively in a stable manner. The binder film can be readily removed with an organic solvent.

The binder film also functions as a protective film for the etchant. In other words, owing to its high resistance to the etchant and its good adhesion to the surface, it protects the coated part (e.g., the obverse of the projection mask) from being corroded by the etchant even if the grooves for separation are broken during etching.

The binder film may be incorporated with an alkali-resistant inorganic filler to control its shrinkage if it shrinks when it is cured (gummified).

In a preferred embodiment of the present invention, the step of forming, by wet etching on the reverse of the substrate, the grooves to separate projection masks, and the step of forming, by wet etching on the reverse of the projection mask, a recess or window and thereby forming the frame and membrane are carried out simultaneously by using the same etchant. This reduces the number of manufacturing steps.

Although carrying out these steps separately is possible, carrying out them simultaneously with the same etchant is more efficient. This is accomplished by forming a wet etching mask on the reverse of the substrate and patterning it at the time when a pattern is formed for the grooves and the recess or window on the reverse of the projection mask.

There are some differences in time between etching to make grooves for separation (which is performed on the reverse of the substrate) and etching to make a recess or window on the reverse of the projection mask. Therefore, either of the following two embodiments is employed to protect the membrane.

In the first embodiment, the step of forming, by wet etching on the reverse of the substrate, the grooves of a prescribed depth to separate projection masks is followed by the step of providing the recess or window on the reverse of the projection mask with a protective material and the subsequent step of completing the grooves by wet etching until wet etching is completed.

In the case of silicon substrate, this embodiment is carried out such that etching is suspended temporarily when etching for the recess or window on the reverse of the projection mask is completed and the etching of grooves is resumed after the recess or window on the reverse of the projection mask has been provided with a protective film.

In the case of SOI substrate, this embodiment is carried out such that etching for the grooves and the recess or window on the reverse of the projection mask is performed as far as the etch stopper layer (intermediate layer) and the intermediate layer is removed by using the other etchant, and the etching of grooves is resumed after the recess or window on the reverse of the projection mask has been provided with a protective film.

The second embodiment involves sequentially performing etching for the grooves and the recess or window on the reverse of the projection mask until the intermediate layer is exposed, providing the recess or window under the membrane and in the reverse of the projection mask with a protective material, removing by etching only the intermediate layer remaining in the grooves, and completing the grooves by wet etching until etching is completed.

In the case of SOI substrate, this embodiment is designed to leave the intermediate layer of the recess or window in the reverse of the projection mask and utilize it as a protective layer against the etchant to form the grooves.

Therefore, the protective material used in the second embodiment merely needs resistance to the etchant (such as dilute hydrofluoric acid and hydrobromofluoric acid) for the intermediate layer. However, it should be different in etching rate from silicon if it is to be used as a protective layer against the etchant for silicon. Therefore, it is desirable to use an organic alkaline etchant, such as an aqueous solution of ethylenehexadiamine and pyrocatechol.

The protective material in the second embodiment may be at least one resin selected from fluorine resin, ethylene resin, propylene resin, butadiene resin, silicone resin, and styrene resin, or a gummy material derived therefrom, or a photosensitive resin, or a film-forming inorganic material (such as SOG and SiN).

According to the present invention, the grooves to separate the projection masks should preferably have a width greater than 1.3 times the total thickness of the substrate.

Anisotropic etching with an alkaline etchant on the (100) plane of silicon substrate proceeds at a slope angle of about 54.73° ($Tan^{-1}\sqrt{2}$) as mentioned above. Therefore, the dimensions of the grooves are necessarily determined in relation to the thickness of the substrate.

Figure 5:
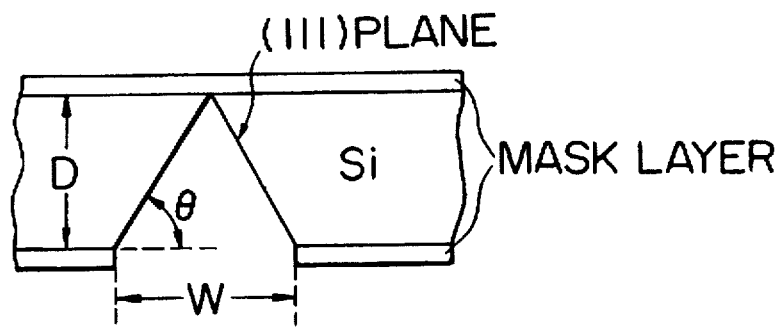
FIG. 5 is a schematic partial sectional view illustrating the relation between the groove width and the etching depth.

To be more specific, the width (W) of the grooves is expressed by Equation (1) below, in which D denotes the thickness of the substrate, as shown in FIG. 5.

$$W=(D/\sqrt{2})\times 2=\sqrt{2}D \qquad (1)$$

Although the theoretical value of W is $\sqrt{2}$ times the depth (D), the actual value of W should preferably be greater than 1.35 times the depth (D) (or about $\sqrt{2}D\pm 5\%$), in view of the fact that the etching rate differs between the (100) plane and the (111) plane depending on the strength of adhesion between the silicon substrate and the wet etching mask or on the kind of etchant used. It is to be noted that etching on the (100) plane proceeds 50 to 200 times as fast as etching on the (111) plane.

According to the present invention, the projection masks should preferably be arranged at regular intervals on the substrate such that the substrate remaining after separation of projection masks has a checker pattern.

Figure 6:
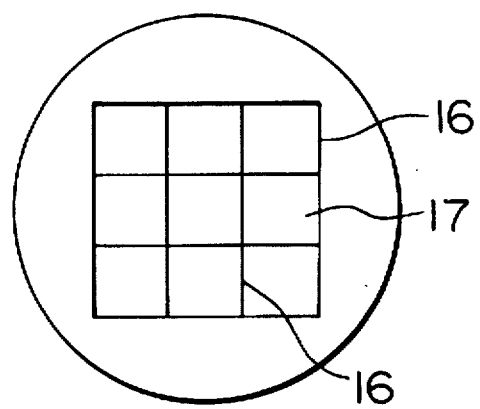
FIG. 6 is a plan view showing an example of the arrangement of grooves and projection masks.

In the prior art technology it has been common practice to arrange a plurality of projection masks on a single substrate such that adjacent projection masks 17 are separated from each other by grooves 16, as shown in FIG. 6.

The disadvantage of this method for arrangement is that the grooves decrease in strength as it becomes deeper, no matter what the process, to such an extent that it breaks during etching. This leads to low yields.

Figure 7:
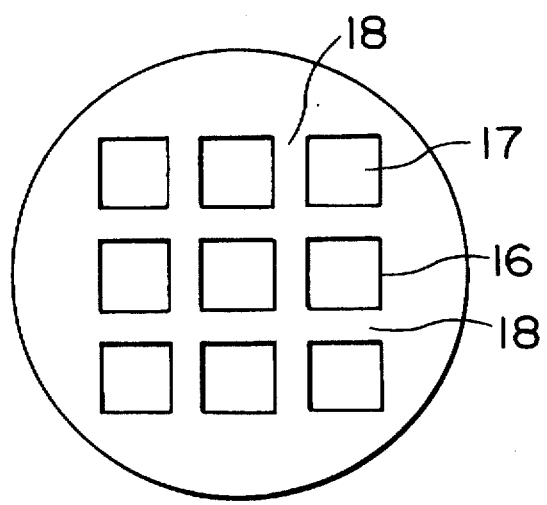
FIG. 7 is a plan view showing another example of the arrangement of grooves and projection masks.

A remedy for this is to arrange a plurality of projection masks 17 at regular intervals on a substrate as shown in FIG. 7, so that the substrate with a checker pattern remains after the projection masks have been separated from the substrate. The gridlike crosspieces 18 integral with the substrate reinforce the periphery of each projection mask and relieve each projection mask from external force and gravity.

Owing to this reinforcement, it is possible to carry out the process steadily until the etching of grooves is completed (or individual projection masks are separated from the substrate). This leads to nearly 100% yields overall.

Figure 8:
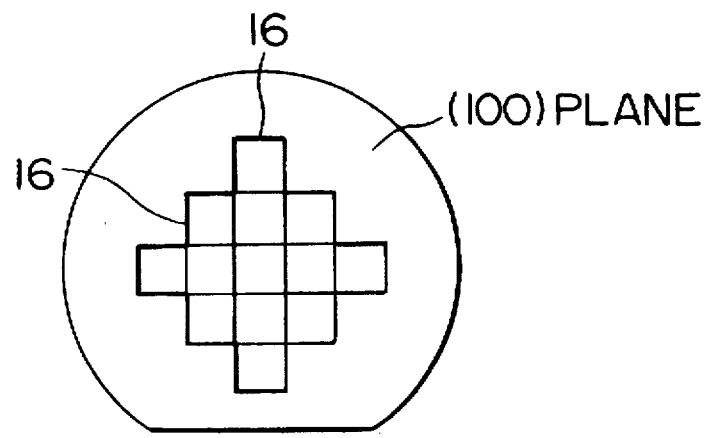
FIG. 8 is a plan view showing another example of the arrangement of grooves and projection masks.

The second aspect of the present invention will be described in detail as follows. It is characterized in that the horizontal and vertical grooves 16 to separate individual projection masks are formed in a checker pattern or lattice on the reverse of the silicon substrate (with the (100) plane) such that they are parallel or perpendicular to the crystal axis (namely, parallel or perpendicular to the orientation flat), as shown in FIG. 8. If the grooves are aslant to the crystal axis, they will suffer random etching due to the lack of etching selectivity of crystals. The grooves in a checker pattern permit stress concentration (which is necessary for accurate working) when projection masks are separated by breaking (usually with hand) along the V-shaped grooves. This object is achieved only by forming grooves uniformly along the periphery of each projection mask.

The grooves formed for separation on the reverse of the substrate should preferably be V-shaped and have a depth smaller than two-thirds the total thickness of the substrate. Such shallow V-shaped grooves permit the mass production of substrates with their reverse processed beforehand. This saves the manufacturing time. Such previously processed substrates permit the production of projection masks simply by performing dry etching on the obverse at prescribed positions aligned with the positions on the reverse. This contributes to the reduction of manufacturing time and delivery periods. Such previously processed substrates may be produced and stored in large quantities without any problem because the size and pattern arrangement of the projection mask are peculiar to each cell projection apparatus and it is only necessary to change the aperture design to order.

The groove depth specified above is based on the experimental result that substrates with deeper grooves are liable to break in subsequent processing steps. To prevent breakage certainly, it is desirable to reduce the groove depth below half the total thickness of the substrate. The V-shaped grooves are easily split (even by hand) even if they are shallow because they are formed along the (111) plane.

As in the first aspect of the present invention, it is necessary that the slope angle of etching for the frame and V-shaped grooves should be 54–56 degrees. In order that the grooves to separate projection masks have a desired depth relative to its width, it is necessary to select a proper groove width (which is equivalent to the width of the slit formed in the wet etching mask) and to utilize the fact that the (100) plane of silicon substrate undergoes anisotropic etching at a slope angle of 55 degrees.

Figure 9:
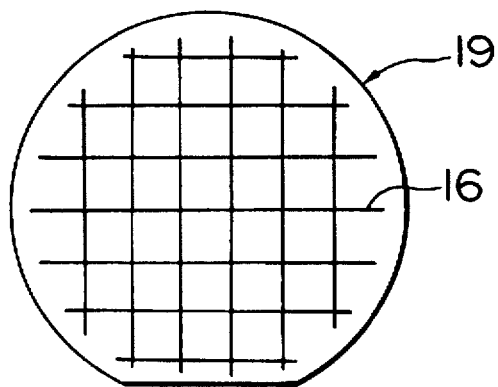
FIG. 9 is a plan view illustrating the region in which grooves are formed.

It is desirable that the grooves 16 for separation on the reverse of the substrate do not extend to the periphery 19 of the substrate as shown in FIG. 9. The reason for this that a silicon single-crystal substrate is liable to break along the (111) plane by stress (such as film stress) if its periphery (or edge) has flaws no matter how shallow the grooves may be (or even in the absence of grooves). To be more specific, the grooves should be 0.2 mm (preferably 0.5 mm) inside the periphery of the substrate so as to avoid breakage.

The separation of projection masks by breaking along the V-shaped grooves should preferably be carried out in running water or flowing solvent. This practice is intended to protect projection masks from contamination with silicon chips which would occur at the time of breaking. The good result of this practice has been confirmed experimentally.

The following description is concerned in common with the first and second aspects of the present invention.

The present invention does not preclude using any known conventional methods, materials, and conditions in addition to those mentioned above. For example, the wet etching mask (to protect the obverse of the substrate and the frame on the reverse of the substrate during wet etching to form the grooves and/or the back recess or window of the projection mask) may be made of a metal selected from tungsten, zirconium, nickel, chromium, and titanium, an alloy thereof, or a metal compound thereof containing at least one element selected from oxygen, nitrogen, and carbon. These metals exhibit good performance as the wet etching mask and permit easy mask forming, mask patterning, and mask removal. In addition, the wet etching mask may be made of an inorganic material such as $SiO_2$, SiC, $Si_3N_4$, SiON, and SiAlON (Si-Al compound mixture).

The metal-based wet etching mask may be formed by any of sputtering, vacuum deposition, and CVD, which are common methods of forming thin film.

The wet etching mask of inorganic material (such as $SiO_2$) may be formed by any of sputtering, vacuum deposition, thermal oxidation, CVD, SOG (spin on glass), and photosensitive SOG, which are common methods of forming thin film.

The wet etching mask should preferably be 0.1–1 μm thick. The one thinner than specified above will not cover the silicon substrate completely, and the one thicker than specified above will need a long time to form and exert a greater film stress.

Any etchant may be used for the patterning and removal of the wet etching mask. For example, an etchant for titanium may be 4% aqueous solution of hydrofluoric acid and nitric acid, an etchant for chromium may be an aqueous solution of ceric-ammonium nitrate and perchloric acid, an etchant for nickel may be ferric chloride, and an etchant for tungsten may be an aqueous solution of potassium ferricyanide.

The etchant for the reverse of silicon substrate may an aqueous solution of KOH or NaOH, an alcohol-containing alkaline aqueous solution, or an organic alkaline aqueous solution. The etching temperature varies depending on the material selected. Etching may be accomplished typically by dipping.

The process of the present invention can be applied to ordinary silicon substrates (bare silicon) because it permits the etching amount (depth) on the reverse of the substrate to be controlled in proportion to the etching time. This contributes to cost reduction.

Dry etching is a desirable way to form the aperture on the obverse of the substrate from the standpoint of accurate working. However, electric discharge machining may also be employed (as disclosed in Japanese Unexamined Patent Publication No. 0217876/1993).

The dry etching mask may be made of a metal selected from titanium, chromium, tungsten, zirconium, and nickel, an alloy thereof, or a metal compound thereof containing any of oxygen, nitrogen, and carbon, an inorganic material such as $SiO_2$, SiC, $Si_3N_4$, SiON, and SiAlON, or an organic material such as resist and photosensitive resin.

The metal-based dry etching mask may be formed by any of sputtering, vacuum deposition, and CVD, which are common methods of forming thin film.

The dry etching mask of inorganic material (such as $SiO_2$) may be formed by any of sputtering, vacuum deposition, thermal oxidation, CVD, SOG (spin on glass), and photosensitive SOG, which are common methods of forming thin film.

The dry etching may be carried out with any etching gas which is not specifically restricted. Etching gas for the $SiO_2$ mask includes fluorocarbon gas, such as $CF_4$, $C_2F_6$, and $CHF_3$. Etching gas for the silicon substrate includes HBr gas, $Cl_2/O_2$ mixture gas, and $SiCl_4/N_2$ mixture gas. Etching gas for the metal conductive layer includes fluorocarbon gas, such as $SF_6/O_2$ mixture gas, $SF_6/Cl_2$ mixture gas, $CF_4/O_2$ mixture gas, and $CBrF_3$ gas. It is possible to perform etching continuously on the metal conductive layer and silicon substrate by using only one kind of etching gas, such as $SF_6$ gas.

The above-mentioned wet etching mask and dry etching mask may undergo patterning by the lithography which consists of steps of applying a resist onto the etching mask, forming a resist pattern by exposure and development, and etching through the resist pattern as a mask. Incidentally, it may be possible to omit the resist process if photosensitive glass is applied to the silicon substrate and it is used as a mask.

Any layer which has fulfilled its duties and become unnecessary should be removed at an adequate stage during processing. For example, the $SiO_2$ layer should be removed with dilute hydrofluoric acid, the resinous binder film and protective film should be removed with an organic solvent, and the wet etching mask should be removed with an etchant.

The projection mask produced according to the present invention may have its surface coated with a metal layer of tantalum (Ta), tungsten (W), molybdenum (Mo), gold (Au), platinum (Pt), silver (Ag), or iridium (Ir). This metal layer is necessary to protect the silicon membrane (in which the aperture is formed) from electron beams and hence to improve the durability of the projection mask. Owing to its good electrical and thermal conductivity, the metal layer also prevents the dislocation of electron beams due to electrification (charge-up) and the distortion of mask due to heat generation. In addition, the metal layer permits the silicon membrane to be made thinner because it effectively screens electron beams and absorbs electron energy. The thinner the membrane, the better the accuracy of aperture and the less the effect on electron beams by the aperture side wall.

The metal layer may be formed by any of sputtering, vacuum deposition, ion beam deposition, CVD, ion plating, electrodepositin, and plating, which are commonly used to form thin film.

The process of the present invention may be modified such that the substrate is coated first with a metal layer and then the aperture is formed by performing dry etching continuously on the metal layer and the silicon membrane. This modified process offers the advantage of not only reducing the processing time but also improving the accurate of aperture easily.

The substrate used in the present invention includes those of silicon, molybdenum aluminum, gold, copper, etc. However, the one which is preferable from the standpoint of chemical resistance, processability, and dimensional accuracy includes silicon substrate, SIO substrates, and SIMOX substrates. The last one is called SIMOX (separation by implanted oxygen) because it is a silicon substrate having a silicon oxide film formed by dense implantation of oxygen ions and subsequent heat treatment). Incidentally, a phosphorus- or boron-doped silicon substrate may also be used where it is necessary to improve the electrical conductivity of the silicon substrate.

The process of the present invention consists of several steps as mentioned above, but their order is not specifically restricted. For example, it is possible to carry out the working of the reverse first and then carry out the patterning of the aperture afterward. In addition, the steps in the present invention may be partly combined with known steps in the conventional process for producing projection masks.

The invention will be described in more detail with reference to the following examples.

EXAMPLE 1

Projection masks were prepared according to the process shown in FIGS. 10A through 10F.

There is shown a multi-layer SOI substrate 10, which is composed of an Si layer 1 (20 μm thick), an $SiO_2$ layer 2 (2

μm thick), and an Si layer 3 (500 μm thick). On the obverse of the substrate (or on the Si layer 1) was formed a dry etching mask 4 (which is a 1-μm thick SiO₂ layer). The dry etching mask 4 was patterned according to the desired aperture by photolithography (FIG. 10A).

Incidentally, individual projection masks were arranged at regular intervals on the substrate as shown in FIG. 7.

Figure 10A:
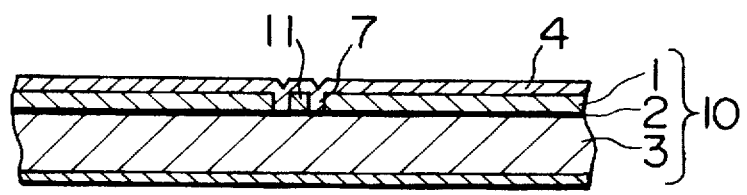
FIGS. 10A through 10F are schematic sectional views illustrating the steps of fabrication in an example by the process of the present invention.

The 20-μm thick Si layer 1 underwent reactive ion etching (RIE) to form the aperture pattern 11 (FIG. 10A). Etching was carried out until the aperture pattern (20 μm deep) reached the 2-μm thick SiO₂ layer 2 (as the etching stopper).

Figure 10B:
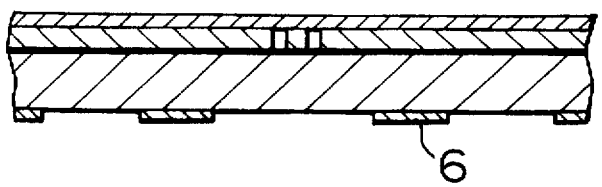

On the reverse of the substrate was formed a wet etching mask 6 (which is a 2-μm thick SiO₂ layer). In the aperture pattern was formed SOG 7 for protection of the obverse of the substrate. The coated substrate underwent heat treatment at 600° C. (FIG. 10A). The wet etching mask 6 on the reverse of the substrate was patterned by photolithography, so that prescribed areas were exposed which are allocated for the grooves to separate projection masks and for the recess or window on the reverse of each projection mask (FIG. 10B).

Figure 10C:
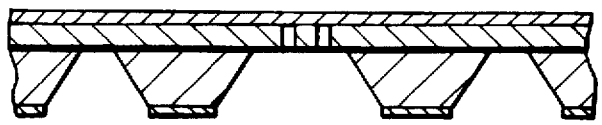

Wet etching was performed on the reverse of the substrate with an aqueous solution of ethylenediamine and pyrocatechol (as an etchant) until the etch stopper (2-μm thick SiO₂ layer) was reached (FIG. 10C).

Figure 10D:
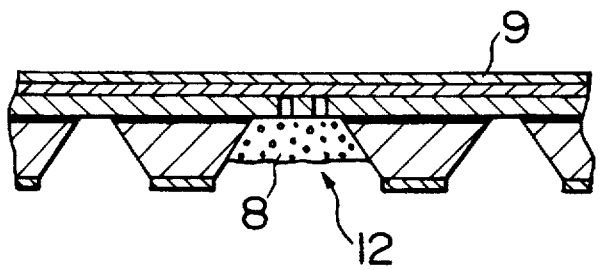
Figure 10E:
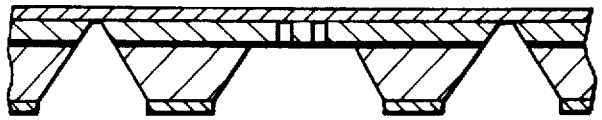

The etch stopper at the bottom of the grooves was removed by etching with dilute hydrofluoric acid, with the recess or window 12 filled with a resist 8 which protects the membrane at the bottom of the recess or window 12. The resist was removed. On the obverse of the substrate was formed a binder film 9 (of ethylenebutadiene resin) to prevent the projection masks from dispersing (FIG. 10D). Wet etching was performed on the reverse of the substrate so as to deepen the grooves until their bottoms reach the obverse of the substrate. Now, the projection mask is separate from the substrate (FIG. 10E).

Owing to the binder film, the projection masks, which were separate from the substrate, did not disperse into the etchant.

Etching with an aqueous solution of ethylenediamine and pyrocatechol proceeded at different rates on the (100) plane and the (111) plane. Practically, etch selectivity between the (100) plane and the (111) plane of silicon was 50:3. Because of this difference in selectivity, etching in the depthwise direction of the grooves was 500 μm, whereas etching in the lateral direction (or in the direction of the (111) plane) was 30 μm. Thus, it was possible to obtain projection masks with accurate external dimensions by establishing a groove width of (500/√2)−30.

The arrangement of projection masks at regular intervals on the substrate as shown in FIG. 7 permitted their steady production without the grooves being broken.

Figure 10F:

Finally, upon removal of the wet and dry etching masks and the binder film, which had become unnecessary, there was obtained the desired projection mask 17 (FIG. 10F).

EXAMPLE 2

The same procedure as in Example 1 was repeated except that the groove width was changed to (500/√2−60)×2. Improved yields were achieved.

EXAMPLE 3

Projection masks were prepared according to the process shown in FIGS. 11A through 11H.

Figure 11A:
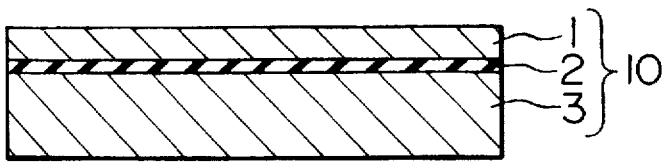
FIGS. 11A through 11H are schematic sectional views illustrating the steps of fabrication in another example by the process of the present invention.
Figure 11B:
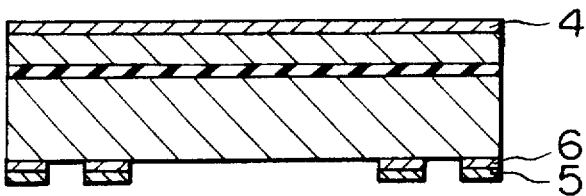

There is shown a multi-layer SOI substrate 10, which is composed of an Si layer 1 (20 μm thick), an SiO₂ layer 2 (2 μm thick), and an Si layer 3 (500 μm thick) (FIG. 11A). On the obverse of the substrate was formed a dry etching mask 4 (which is a 1-μm thick Cr layer). On the reverse of the substrate was formed a wet etching mask 6 (which is a 3000Å thick Ti film). The wet etching mask 6 was patterned by photolithography with resist 5 so that silicon was exposed in the areas where grooves to separate the projection masks and the recess or window in the projection masks are to be formed on the reverse of the substrate (FIG. 11B).

Grooves were not formed in the region which is within 2 mm of the periphery of the substrate.

Figure 11C:
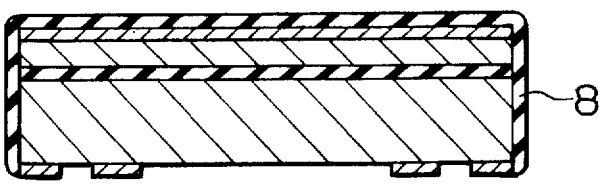

After removal of the resist, the obverse and side of the substrate were coated by spin coating with a 100-μm thick film 8 of ethylene-butadiene resin for protection against the etchant. The resin was gummified (FIG. 11C).

Figure 11D:
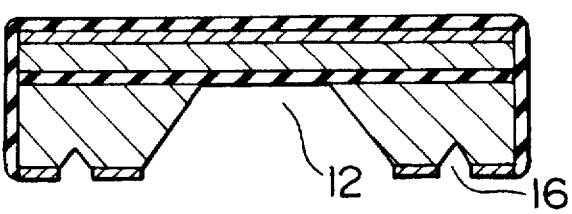

The exposed part of silicon on the reverse of the substrate underwent wet etching with a KOH aqueous solution heated at 100° C. (FIG. 11D). The grooves 16 to separate projection masks have a width large enough for it to become 100 μm deep by etching. Wet etching was allowed to proceed as far as the etch stopper (the 2-μm thick SiO₂ layer), so that the recess or window 12 was formed in the projection mask.

Figure 11E:
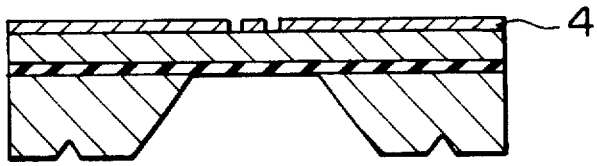

After rinsing with pure water, the wet etching mask and the protective layer were removed. The dry etching mask 4 (Cr layer) on the obverse of the substrate was patterned by photolithography according to the desired aperture (FIG. 11E).

Figure 11F:
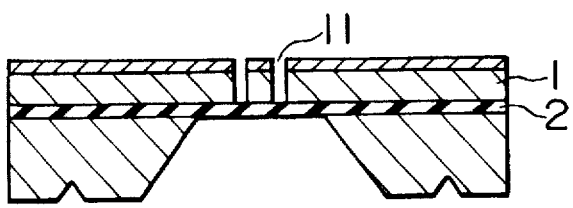

The 20-μm thick Si layer 1 underwent reactive ion etching (RIE) to form the aperture pattern 11 (FIG. 11F). Etching was carried out until the aperture pattern (20 μm deep) reached the 2-μm thick SiO layer 2 (as the etch stopper).

Figure 11G:
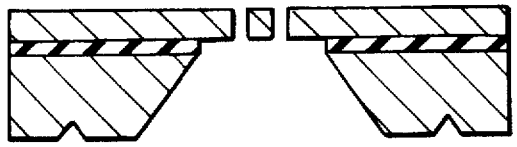

The dry etching mask (Cr layer) was removed with an aqueous solution of cerium-ammonium nitrate, and the etch stopper (SiO₂ layer) at the bottom of the recess or window was removed with dilute hydrofluoric acid so that the aperture was completed (FIG. 11G).

In this way a plurality of projection masks were formed on the silicon substrate.

Figure 11H:
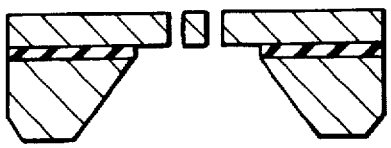

The projection masks were separated from one another along the V-shaped grooves within a flowing water (FIG. 11H). The fragments of the substrate remaining after separation of the projection masks were also removed in the flowing water. In this way, it was possible to carry out dicing easily without causing contamination to the projection masks.

The effect of forming grooves in the region within 2 mm of the periphery of the substrate, as in Example 2, was demonstrated by the fact that there was no failure out of ten whereas there was six failures out of ten in the case of grooves extending to the periphery of the substrate.

The procedure in Example 2 makes it possible to previously produce the intermediate product in large quantities which has V-shaped grooves for separation or a dry etching mask for the patterning of the aperture. This intermediate product can be easily made into the desired projection mask merely by patterning the aperture. The last step takes only one-third the time for production by the conventional process. Therefore, according to the present invention, it is possible to produce projection masks within several days after receipt of the aperture pattern design from the customer. This leads to reduction in delivery periods. The accuracy of external dimensions was ±6.5 μm of the design value.

EXAMPLE 4

Projection masks were prepared according to the process shown in FIGS. 12A through 12E.

There is shown a multi-layer SOI substrate 10, which is composed of an Si layer 1 (20 µm thick), an SiO₂ layer 2 (2 µm thick), and an Si layer 3 (500 µm thick). On the obverse (the 20-µm thick Si layer) of the substrate was formed a dry etching mask 4 (which is a 1-µm thick SiO₂ layer). This etching mask was patterned for the desired aperture by photolithography.

Figure 12A:
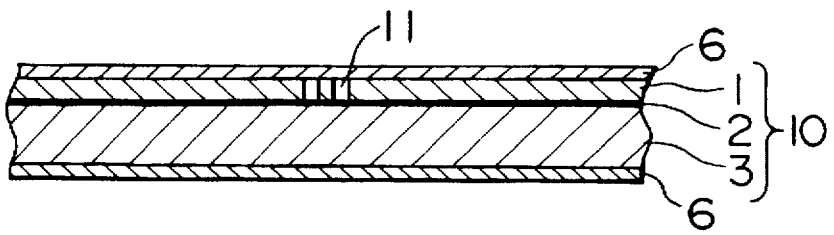
FIGS. 12A through 12E are schematic sectional views illustrating the steps of fabrication in another example by the process of the present invention.

The 20-µm thick Si layer 1 underwent reactive ion etching (RIE) to form the aperture pattern 11 (FIG. 12A). Etching was carried out until the aperture pattern (20 µm deep) reached the 2-µm thick SiO₂ layer 2 (as the etch stopper) (FIG. 12A).

On the obverse and reverse of the substrate was formed a wet etching mask 6 which is a 2-µm thick SiO₂ layer (FIG. 12A).

Figure 12B:
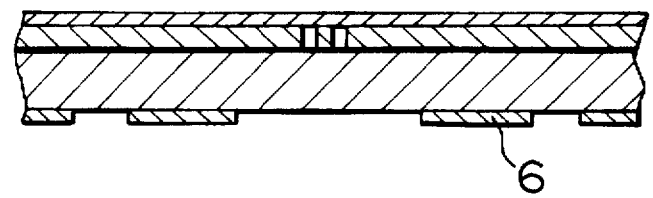

The wet etching mask 6 on the reverse of the substrate was patterned by photolithography so that silicon was exposed in the areas where grooves to separate the projection masks and the recess or window in the projection mask are to be formed on the reverse of the substrate (FIG. 12B).

Grooves were not formed in the region which is within 2 mm of the periphery of the substrate.

Figure 12C:
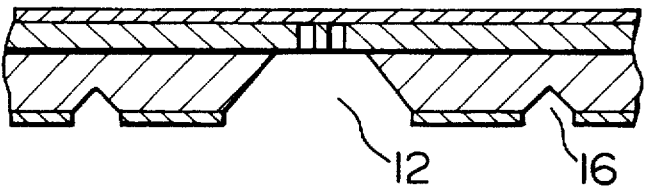

The exposed part of silicon on the reverse of the substrate underwent wet etching with a KOH aqueous solution heated at 100° C. (FIG. 12C). The grooves 16 to separate projection masks have a width large enough for it to become 100 µm deep by etching (the groove width equals the width of the slit for groove etching which is formed in the wet etching mask). This design is intended to prevent etching from advancing more than a certain depth relative to the slit width in view of the fact that etching proceeds anisotropically at a slope angle of 55 degrees in the case of a silicon substrate with the (100) plane.

Wet etching was advanced to the etch stopper (the 2-µm thick SiO₂ layer), so that the recess or window 12 was formed in the projection mask (FIG. 12C).

Figure 12D:
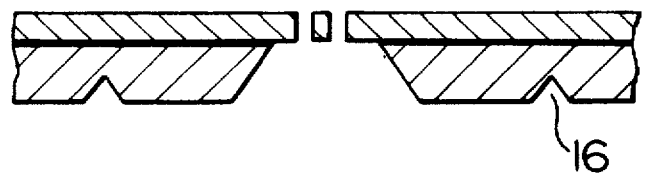

The wet etching mask 6 on the obverse and the reverse of the substrate was removed, and the etch stopper (SiO₂ layer) at the bottom of the recess was removed with dilute hydrofluoric acid so that the aperture was completed (FIG. 12D).

In this way, a plurality of projection masks were formed on the silicon substrate.

Figure 12E:

The projection masks were separated from one another along the V-shaped grooves 16 within a flowing water (FIG. 12E). The fragments of the substrate remaining after separation of the projection masks were also removed in the flowing water. In this way, it was possible to carry out dicing easily without causing contamination to occur on the projection masks.

The process in this example was very stable because none of ten samples were broken.

EXAMPLE 5

Each sample of the projection masks obtained in Examples 1 to 4 was coated by vacuum deposition with a 0.5-µm thick film of platinum or palladium. The coated sample was found to be more than five times as resistant to electron beams as the uncoated sample.

EXAMPLE 6

The procedure like in Examples 1 to 4 was repeated except that the obverse of the substrate was coated with a metal film and the aperture was formed by performing dry etching continuously on the metal film and then on the substrate. It was found that the resulting sample has a more accurate aperture than the sample which is coated with a metal layer after the aperture has been formed.

It is to be understood that the present invention is not limited to the specific embodiments mentioned above. For example, substitution of SIMOX substrates for SOI substrates produced the same result as mentioned above.

The projection mask pertaining to the present invention will find use as a mask for electron beam exposure, ion beam exposure, or X-ray exposure.

It has been demonstrated above that the process of the present invention permits the efficient, economical production of projection masks having accurate external dimensions and peripheral walls. The efficient production solves the problem with delivery periods which has been a hindrance to putting the projection mask into practical use. Therefore, the present invention is of great industrial value.

What is claimed is:

1. A process of manufacturing a plurality of projection masks at one time from a substrate having an obverse and a reverse, each of the projection masks comprising a frame, a membrane supported by the frame, and apertures formed in the membrane, the process comprising the steps of:

forming grooves on the reverse of the substrate only by wet etching; and separating the substrate into the projection masks by the use of the grooves formed on the reverse of the substrate.

2. A process as claimed in claim 1, wherein the substrate is formed by a material selected from the group consisting of a silicon substrate, a laminate silicon substrate, or a multi-layer silicon substrate and has the obverse and the reverse of the (100) plane, the etching being carried out so that the frame and the grooves have a slope angle within a range between 54 and 56 degrees.

3. A process as claimed in claim 2, further comprising the step of:

forming a binder film to prevent the separation of the projection masks after completion of the wet etching from the reverse of the substrate and before separation of the individual projection masks.

4. A process as claimed in claims 3, wherein the binder film is formed from a material selected from the group consisting of fluorine resin, ethylene resin, propylene resin, butadiene resin, silicon resin, styrene resin, a gummy material derived from the above-mentioned material, and an inorganic film-forming material.

5. A process as claimed in claim 4, further comprising the step of:

forming a window on the reverse of the substrate by wet etching together with the grooves to provide the frame and the membrane.

6. A process as claimed in claim 5, further comprising the step of:

covering the window with a protective material; and thereafter completing the grooves by wet etching.

7. A process as claimed in claim 1, further comprising the step of forming a binder film to prevent the separation of projection masks after completion of the wet etching from the reverse and before separation of the individual projection masks.

8. A process as claimed in claim 7, wherein the binder film is formed from at least one material selected from the group consisting of fluorine resin, ethylene resin, propylene resin, butadiene resin, silicone resin, and styrene resin, a gummy material derived therefrom, and an inorganic film-forming material.

9. A process as claimed in claim 1, wherein the step of forming the grooves of a prescribed depth by wet etching on the reverse of the substrate to separate projection masks is carried out by the use of the same etchant as the step of forming, by wet etching on the reverse of the projection mask, a window to thereby form the frame and the membrane.

10. A process as claimed in claim 1, wherein the step of forming the grooves of a prescribed depth by wet etching on the reverse of the substrate is followed by the step of forming a window on the lower part of the membrane on the reverse of the projection mask and thereafter by subsequent step of completing forming the grooves by wet etching.

11. A process as claimed in claim 10, further comprising the step of:

covering the window with a protective material to form a protective layer.

12. A process as claimed in claim 10, wherein the protective material is formed by at least one material selected from the group consisting of fluorine resin, ethylene resin, propylene resin, butadiene resin, silicone resin, styrene resin, a gummy material derived from the above-mentioned resins, and an inorganic film-forming material.

13. A process as claimed in claim 1, the substrate comprising an etching stopper layer interposed between a pair of semiconductor layers providing the obverse and the reverse of the substrate, further comprising the steps of:

removing the etching stopper layer by etching after the grooves and a window are formed to separate the projection masks and to expose the frame and the membrane;

covering, with a protective material, the membrane which has a lower part exposed within the window on the reverse of the substrate; and thereafter completing the grooves by wet etching.

14. A process as claimed in claim 1, wherein the grooves to separate the projection masks have a width greater than 1.3 times the total thickness of the substrate.

15. A process as claimed in claim 1, wherein the projection masks are arranged at regular intervals on the substrate such that the substrate remaining after separation of projection masks has a checker pattern.

16. A process as claimed in claim 1, wherein the wet etching to form the grooves and/or the window on the reverse of the projection mask employs a masking layer to protect those parts which are not etched, said masking layer being made of a metal selected from the group consisting of tungsten, zirconium, nickel, chromium, titanium, an alloy thereof, and a metal compound thereof containing at least one element selected from oxygen, nitrogen, and carbon.

17. A process of manufacturing a plurality of projection masks from a substrate at one time, each of the projection masks consisting of a frame, a membrane supported by the frame, and apertures formed in the membrane, the process comprising the steps of:

preparing a substrate which has an obverse and a reverse, at least said reverse being specified by the (001) plane;

forming, by etching, grooves which run along horizontal and vertical directions to form a lattice such that the vertical and the horizontal grooves are parallel to and perpendicular to the crystal axis of the reverse of the silicon substrate, respectively; and dividing the substrate into individual projection masks.

18. A process as defined in claim 17, wherein the substrate is formed by a substrate selected from the group consisting of a silicon substrate, a laminate silicon substrate, and a multi-layer silicon substrate.

19. A process as defined in claim 17, wherein the grooves formed for separation on the reverse of the substrate have a depth smaller than two-thirds the total thickness of the substrate.

20. A process as claimed in claim 17, wherein the etching for the frame and the grooves is carried out so that the frame and the grooves have a slope angle within a range between 54 and 56 degrees.

21. A process as claimed in claim 17, wherein the grooves formed for separation on the reverse of the substrate are remote from the outer periphery of the substrate.

22. A process as claimed in claim 17, wherein the separation by breaking along the grooves is carried out within selected one of flowing water or flowing solvent.

* * * * *